United States Patent [19]
Chen et al.

[11] Patent Number: 5,942,446
[45] Date of Patent: Aug. 24, 1999

[54] FLUOROCARBON POLYMER LAYER DEPOSITION PREDOMINANT PRE-ETCH PLASMA ETCH METHOD FOR FORMING PATTERNED SILICON CONTAINING DIELECTRIC LAYER

[75] Inventors: Chao-Cheng Chen, Matou; Chen-Hua Yu, Pao-Sheng County, both of Taiwan

[73] Assignee: Taiwan Semiconductor Manufacturing Company, Ltd., Hsin-Chu, Taiwan

[21] Appl. No.: 08/928,235

[22] Filed: Sep. 12, 1997

[51] Int. Cl.⁶ ...................................................... H01L 21/00
[52] U.S. Cl. ............................. 438/734; 216/67; 216/79; 438/743; 438/744
[58] Field of Search ....................... 216/67, 79; 438/639, 438/723, 724, 734, 743, 744

[56] References Cited

U.S. PATENT DOCUMENTS

| | | | |
|---|---|---|---|
| 4,613,400 | 9/1986 | Tam et al. .................................. | 156/643 |
| 5,100,504 | 3/1992 | Kawai et al. ......................... | 438/734 X |
| 5,338,399 | 8/1994 | Yanagida .................................. | 156/662 |
| 5,342,481 | 8/1994 | Kadomura ............................. | 156/659.1 |
| 5,453,403 | 9/1995 | Meng et al. ............................. | 438/734 |
| 5,854,134 | 12/1998 | Lan et al. ............................. | 438/734 X |

*Primary Examiner*—William Powell
*Attorney, Agent, or Firm*—George O. Saile; Stephen B. Ackerman; Alek P. Szecsy

[57] ABSTRACT

A method for forming a patterned silicon containing dielectric layer within a microelectronics fabrication. There is first provided a substrate employed within a microelectronics fabrication. There is then formed over the substrate a silicon containing dielectric layer. There is then formed upon the silicon containing dielectric layer a hard mask layer, where the hard mask layer leaves exposed a portion of the silicon containing dielectric layer. There is then etched partially through a first plasma etch method the silicon containing dielectric layer to form a partially etched silicon containing dielectric layer. The first plasma etch method employs a first etchant gas composition comprising a first fluorocarbon etchant gas which predominantly forms a fluoropolymer layer upon at least the hard mask layer. Finally, there is then etched through a second plasma etch method the partially etched silicon containing dielectric layer to form a patterned silicon containing dielectric layer. The second plasma etch method employs a second etchant gas composition comprising a second fluoro etchant gas which predominantly etches the partially etched silicon containing dielectric layer in forming the patterned silicon containing dielectric layer.

9 Claims, 4 Drawing Sheets

FLUOROCARBON POLYMER LAYER DEPOSITION PREDOMINANT PRE-ETCH PLASMA ETCH METHOD FOR FORMING PATTERNED SILICON CONTAINING DIELECTRIC LAYER

BACKGROUND OF THE INVENTION

1. Field of the Invention

The present invention relates generally to plasma etch methods for forming patterned layers within microelectronics fabrications. More particularly, the present invention relates to plasma etch methods for forming patterned silicon containing dielectric layers within microelectronics fabrications.

2. Description of the Related Art

As microelectronics integration levels have increased and microelectronics device and conductor element dimensions have decreased, it has become increasingly important to form within advanced microelectronics fabrications narrow aperture width contact and interconnection vias through dielectric layers to access within those advanced microelectronics fabrications narrow linewidth patterned conductor layers and narrow linewidth microelectronics devices formed within those advanced microelectronics fabrications.

While narrow aperture width contact and interconnection vias of substantial areal density are invariably required within advanced microelectronics fabrications to fulfill advanced microelectronics integration requirements, narrow aperture width contact and interconnection vias of substantial areal density are typically not readily formed without problems within advanced microelectronics fabrications. In general, problems are typically encountered when it is desired to form through plasma etch methods within advanced microelectronics fabrications narrow aperture width contact and interconnection vias of aperture width and/or spacing of less than about 0.35 microns through dielectric layers of thicknesses greater than about 10000 angstroms. Under such conditions, narrow aperture width contact and interconnection vias of substantial areal density within advanced microelectronics fabrications are generally difficult to form due to: (1) a limited depth of focus through which may be formed patterned photoresist etch mask layers to be employed in forming high areal density narrow aperture width contact and interconnection vias within microelectronics fabrications; and (2) a typically comparatively low dielectric layer to photoresist etch mask layer plasma etch rate ratio of from about 2:1 to about 3:1 which in conjunction with the limited depth of focus provides inadequate photoresist etch mask layer thickness to adequately etch a narrow aperture width contact or interconnection via completely through a typical dielectric layer within an advanced microelectronics fabrication without completely consuming the patterned photoresist etch mask layer and thus consequently subsequently partially consuming the dielectric layer.

In order to avoid photoresist etch mask layer thickness limitations and consequent dielectric layer etch depth limitations within advanced microelectronics fabrications, it has been proposed in the art of advanced microelectronics fabrication to employ hard mask layers in place of photoresist etch mask layers when forming narrow aperture width contact and interconnection vias through dielectric layers, such as but not limited to silicon oxide dielectric layers, silicon nitride dielectric layers and silicon oxynitride dielectric layers, within advanced microelectronics fabrications through plasma etch methods. Although hard mask layers theoretically provide significant improvements in dielectric layer to hard mask layer etch selectivity within plasma etch methods within advanced microelectronics fabrications, such hard mask layers typically provide such improvements at the expense of: (1) dielectric layer plasma etch rate and/or; (2) contact or interconnection via sidewall etch profile.

It is thus desirable within the art of advanced microelectronics fabrication to provide hard masking methods and materials within plasma etch methods through which there may be formed comparatively narrow aperture width contact and interconnection vias through silicon containing dielectric layers within advanced microelectronics fabrications with improved (ie: increased) etch rates and improved (ie: smoother) via sidewall profiles. It is towards these goals that the present invention is generally directed.

Various novel plasma etch methods have been disclosed in the art of microelectronics fabrication to address various problems encountered when plasma etching microelectronics layers within microelectronics fabrications. For example, Tam et al., in U.S. Pat. No. 4,613,400, discloses a plasma hardening method for forming a patterned photoresist etch mask layer employed in forming a patterned chlorine containing plasma etchable layer with replicable dimensions within an integrated circuit microelectronics fabrication. The method provides for forming a silicon and chlorine containing barrier material layer upon the patterned photoresist layer and subsequently oxidizing the silicon and chlorine containing barrier material layer within an oxygen containing plasma.

In addition, Yanagida, in U.S. Pat. No. 5,338,399, discloses a plasma etch method for forming a contact via through a silicon containing dielectric layer within an integrated circuit microelectronics fabrication, where the contact via is formed with a high etch rate of the silicon containing dielectric layer, a high selectivity for the silicon containing dielectric layer with respect to a photoresist etch mask layer employed in defining the contact via, low particulate contamination of the silicon containing dielectric layer and low silicon semiconductor substrate damage. The plasma etch method employs when forming the contact via a cyclic saturated perfluorocarbon etchant gas or a cyclic unsaturated perfluorocarbon etchant gas which yields more perfluorocarbon radicals per molecule than a conventional carbon tetrafluoride etchant gas.

Finally, Kadomura, in U.S. Pat. No. 5,342,481 discloses a plasma etch method for anisotropic etching of blanket layers within microelectronics fabrications while employing reverse tapered patterned photoresist layers as photoresist etch mask layers when anisotropic etching the blanket layers within the microelectronics fabrications. The method employs a plasma which deposits discharge reaction products upon the reverse tapered patterned photoresist etch mask layer to provide a substantially vertically tapered patterned photoresist etch mask layer sidewall therefrom either prior to or concurrent with anisotropic etching a blanket layer to form a patterned layer therefrom with reproducible dimensions.

Desirable in the art are additional hard masking methods and materials within plasma etch methods through which there may be formed comparatively narrow aperture width contact and interconnection vias through dielectric layers within advanced microelectronics fabrications with improved etch rates and improved via sidewall profiles. More particularly desirable in the art are additional hard masking methods and materials within plasma etch methods through which there may be formed comparatively narrow aperture width contact and interconnection vias through dielectric layers within advanced integrated circuit microelectronics fabrications with improved etch rates and improved via sidewall profiles. It is towards these goals that the present invention is more specifically directed.

SUMMARY OF THE INVENTION

A first object of the present invention is to provide a hard masking method within a plasma etch method through which may be formed a comparatively narrow aperture width contact or interconnection via within a microelectronics fabrication.

A second object of the present invention is to provide a method in accord with the first object of the present invention, where the comparatively narrow aperture width contact or interconnection via is formed with an improved etch rate and an improved via sidewall profile.

A third object of the present invention is to provide a method in accord with the first object of the present invention or the second object of the present invention, where the microelectronics fabrication is an integrated circuit microelectronics fabrication.

A fourth object of the present invention is to provide a method in accord with the first object of the present invention, the second object of the present invention or the third object of the present invention, which method is readily manufacturable.

In accord with the objects of the present invention, there is provided by the present invention a hard masking method within a plasma etch method for forming a via through a dielectric layer within a microelectronics fabrication. To practice the method of the present invention, there is first provided a substrate employed within a microelectronics fabrication. There is then formed over the substrate a silicon containing dielectric layer. There is then formed upon the silicon containing dielectric layer a hard mask layer, where the hard mask layer leaves exposed a portion of the silicon containing dielectric layer. There is then etched partially through a first plasma etch method the silicon containing dielectric layer to form a partially etched silicon containing dielectric layer. The first plasma etch method employs a first etchant gas composition comprising a first fluorocarbon etchant gas which predominantly forms a fluorocarbon polymer layer upon at least the hard mask layer. There is then etched through a second plasma etch method the partially etched silicon containing dielectric layer to form a patterned silicon containing dielectric layer. The second plasma etch method employs a second etchant gas composition comprising a second fluoro etchant gas which predominantly etches the partially etched silicon containing dielectric layer in forming the patterned silicon containing dielectric layer.

The present invention provides a hard masking method within a plasma etch method through which may be formed a comparatively narrow aperture width contact or interconnection via through a silicon containing dielectric layer within a microelectronics fabrication, where the comparatively narrow aperture width contact or interconnection via is formed with an improved etch rate and an improved via sidewall profile. The method of the present invention realizes the foregoing objects by employing when forming a patterned silicon containing dielectric layer from a silicon containing dielectric layer through the method of the present invention: (1) a first plasma etch method which employs a first etchant gas composition comprising a first fluorocarbon etchant gas which predominantly forms a fluorocarbon polymer layer upon at least a hard mask layer employed in forming a partially etched silicon containing dielectric layer from the silicon containing dielectric layer, followed by; (2) a second plasma etch method employing a second etchant gas composition comprising a second fluoro etchant gas which predominantly etches the partially etched silicon containing dielectric layer in forming the patterned silicon containing dielectric layer. While the mechanism through which the first plasma etch method employed within the method of the present invention provides enhanced etch rates and improved via sidewall profiles when forming patterned silicon containing dielectric layers from silicon containing dielectric layers through the method of the present invention is not entirely understood, it is nonetheless clear that a patterned silicon containing dielectric layer formed through the method of the present invention is formed with an improved (ie: increased) etch rate and an improved (ie: smoother) via sidewall profile in comparison with an otherwise equivalent patterned silicon containing dielectric layer formed through a method otherwise equivalent to the method of the present invention but absent the first plasma etch method.

The method of the present invention may be employed where the microelectronics fabrication is an integrated circuit microelectronics fabrication. The method of the present invention does not discriminate with respect to the nature of a microelectronics fabrication within which there is formed a patterned silicon containing dielectric layer having a via formed therethrough in accord with the method of the present invention. Thus, although the method of the present invention is most likely to provide value in forming patterned silicon containing dielectric layers having high areal density vias formed therethrough within integrated circuit microelectronics fabrications, the method of the present invention may be employed in forming patterned silicon containing dielectric layers within microelectronics fabrications including but not limited to integrated circuit microelectronics fabrications, solar cell microelectronics fabrications, ceramic substrate microelectronics fabrications and flat panel display microelectronics fabrications.

The method of the present invention is readily manufacturable. The method of the present invention employs hard masking materials and plasma etch methods which are generally known in the art of microelectronics fabrication. Since it is largely the ordering of the etch methods within the method of the present invention, rather than the existence of the etch methods within the method of the present invention, that provides the present invention, the method of the present invention is readily manufacturable.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENT

The present invention provides a hard masking method within a plasma etch method through which may be formed a comparatively narrow aperture width contact or interconnection via through a silicon containing dielectric layer within a microelectronics fabrication, where the comparatively narrow aperture width contact or interconnection via is formed with an improved etch rate and an improved via sidewall profile. The method of the present invention realizes the foregoing objects by employing when forming from a silicon containing dielectric layer a patterned silicon containing dielectric layer having the via formed therethrough: (1) a first plasma etch method which employs a first etchant gas composition comprising a first fluorocarbon etchant gas which predominantly forms a fluorocarbon polymer layer upon at least a hard mask layer employed within the hard masking method when forming a partially etched silicon containing dielectric layer from the silicon containing dielectric layer; and (3) a second plasma etch method employing a second etchant gas composition comprising a second fluoro etchant gas which predominantly etches the partially etched silicon containing dielectric layer in forming the patterned silicon containing dielectric layer. While the mechanism through which the first plasma etch method employed within the method of the present invention provides improves etch rates and improved via sidewall profiles when forming from silicon containing dielectric layers patterned silicon containing dielectric layers having comparatively narrow aperture width vias formed therethrough is not entirely clear, it is nonetheless clear that a via formed through a patterned silicon containing dielectric layer in accord with the method of the present invention is formed with improved etch rate and improved via sidewall profile in comparison with an otherwise equivalent via formed through an otherwise equivalent patterned silicon containing dielectric layer formed through a method otherwise equivalent to the method of the present invention but absent the first plasma etch method.

Although the method of the present invention is most likely to provide value in forming patterned silicon oxide dielectric layers having high areal density vias formed therethrough within integrated circuit microelectronics fabrications, the method of the present invention may also be employed in forming patterned silicon containing dielectric layers such as but not limited to patterned silicon oxide dielectric layers, patterned silicon nitride dielectric layers and patterned silicon oxynitride dielectric layers having vias formed therethrough within microelectronics fabrications including but not limited to integrated circuit microelectronics fabrications, solar cell microelectronics fabrications, ceramic substrate microelectronics fabrications and flat panel display microelectronics fabrications.

First Preferred Embodiment

Figure 1:
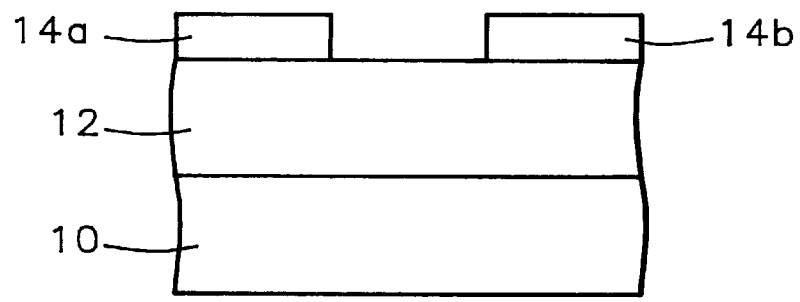
FIG. 1 to FIG. 3 show a series of schematic cross-sectional diagrams illustrating the results of progressive stages in forming within a microelectronics fabrication a pair of patterned silicon containing dielectric layers in accord with a general preferred embodiment of the present invention which comprises a first preferred embodiment of the present invention.
Figure 2:
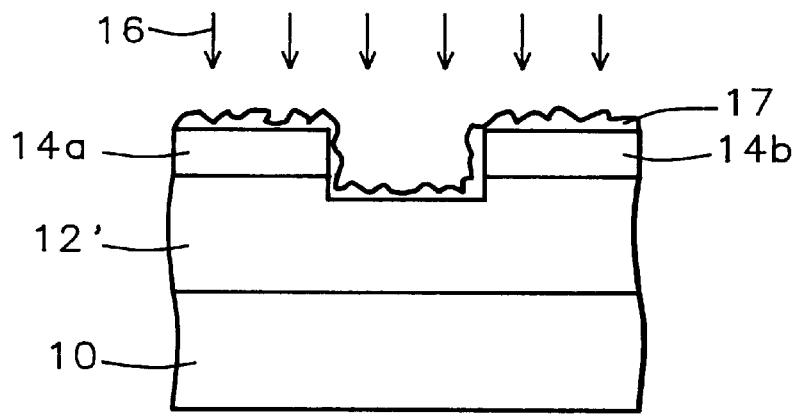
Figure 3:
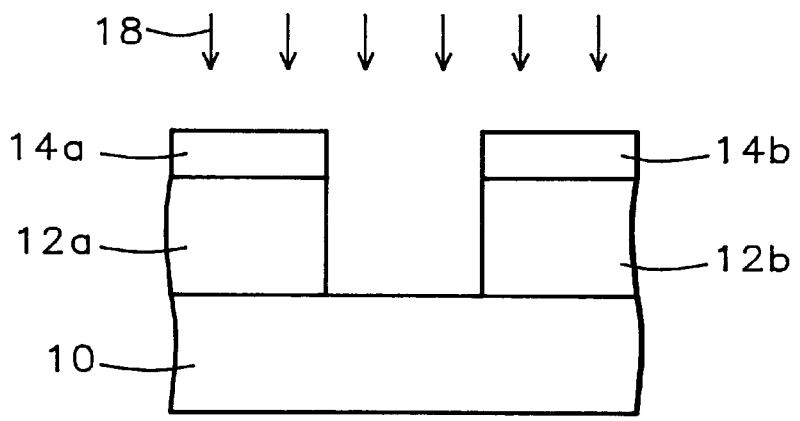

Referring now to FIG. 1 to FIG. 3, there is shown a series of schematic cross-sectional diagrams illustrating the results of progressive stages in forming within a microelectronics fabrication a patterned silicon containing dielectric layer having a via formed therethrough in accord with a general preferred embodiment of the present invention which comprises a first preferred embodiment of the present invention. Shown in FIG. 1 is a schematic cross-sectional diagram of the microelectronics fabrication at an early stage in its fabrication.

Shown in FIG. 1 is a substrate 10 employed within a microelectronics fabrication, where the substrate 10 has formed thereupon a silicon containing dielectric layer 12 which in turn has formed thereupon a pair of hard mask layers 14a and 14b. Within the first preferred embodiment of the present invention, the microelectronics fabrication may be chosen from the group of microelectronics fabrications including but not limited to integrated circuit microelectronics fabrications, solar cell microelectronics fabrications, ceramic substrate microelectronics fabrications and flat panel display microelectronics fabrications.

Similarly, within the first preferred embodiment of the present invention, the silicon containing dielectric layer 12 may be formed from a silicon containing dielectric material chosen from the group of silicon containing dielectric materials including but not limited to silicon oxide dielectric materials, silicon nitride dielectric materials and silicon oxynitride dielectric materials. Such silicon containing dielectric materials are known in the art of microelectronics fabrication to be formed through methods including but not limited to chemical vapor deposition (CVD) methods, plasma enhanced chemical vapor deposition (PECVD) methods and physical vapor deposition (PVD) sputtering methods. Preferably, the silicon containing dielectric layer 12 is formed to a thickness of from about 9000 to about 11000 angstroms upon the substrate 10.

Similarly, within the first preferred embodiment of the present invention, the hard mask layers 14a and 14b may be formed of any hard masking material which is not substantially etched within a fluorine containing etching plasma which is subsequently employed in forming from the silicon containing dielectric layer 12 a patterned silicon containing dielectric layer having a via formed therethrough. Such hard mask materials may include, but are not limited to, certain metals, metal alloys, metal oxides and metal nitrides, as well as silicon materials. For the first preferred embodiment of the present invention, the hard mask layers 14a and 14b are preferably formed of a titanium nitride material or an amorphous silicon material since titanium nitride materials and amorphous silicon materials form thin film layers having anti-reflective properties from which may be formed hard mask layers of optimal dimensional stability and reproducibility within microelectronics fabrications. Preferably, the hard mask layers 14a and 14b are each formed to a thickness of from about 500 to about 1400 angstroms with linewidth and/or pitch dimensions of from about 0.35 to about 0.65 microns upon the silicon containing dielectric layer 12 through a photolithographic method as is conventional in the art of microelectronics fabrication. As is illustrated by its absence within FIG. 1, within the method of the present invention a patterned photoresist etch mask layer which is employed in forming the hard mask layers 14a and 14b has been stripped from the microelectronics fabrication whose schematic cross-sectional diagram is illustrated in FIG. 1.

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the silicon containing dielectric layer 12 has been slightly etched to form a partially etched silicon containing dielectric layer 12' within a fluorocarbon polymer layer deposition predominant plasma 16. While slightly etching the silicon containing dielectric layer 12 within the fluorocarbon polymer layer deposition predominant plasma 16, there is simultaneously formed a fluorocarbon polymer layer 17 upon exposed surfaces of at least the hard mask layers 14a and 14b, and generally both the partially etched silicon containing dielectric layer 12' and the hard mask layers 14a and 14b.

Within the first preferred embodiment of the present invention, the fluorocarbon polymer layer deposition predominant plasma 16 employs a first etchant gas composition comprising a first fluorocarbon etchant gas through which is predominantly formed the fluorocarbon polymer layer 17 in comparison with etching of the silicon containing dielectric layer 12 to form the partially etched silicon containing dielectric layer 12'. Such fluorocarbon etchant gases typically include, but are not limited to, fluorocarbon etchant gases having a hydrogen:carbon atomic ratio at least about than about 2:1 and a fluorine:carbon atomic ratio no greater than about 2:1. Such fluorocarbon etchant gases preferably include but are not limited to [mono]fluoromethane and difluoromethane, as well as higher order open chained, branched chained and cyclic fluorocarbon etchant gases which fulfill the foregoing hydrogen:carbon atomic ratio and fluorine:carbon atomic ratio criteria. Typically and preferably, the fluoropolymer layer 17 is formed within the fluorocarbon polymer layer deposition predominant plasma 16 to a thickness of from about 100 to about 300 angstroms upon the exposed portions of the hard mask layers 14a and 14b and the partially etched silicon containing dielectric layer 12'. Typically and preferably, the silicon containing dielectric layer 12 is negligible etched within the fluorocarbon polymer layer deposition predominant plasma 16 when forming the partially etched silicon containing dielectric layer 12'.

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein the partially etched silicon containing dielectric layer 12' is etched to form the patterned silicon containing dielectric layers 12a and 12b through etching within a silicon containing dielectric layer etching predominant plasma 18.

Within the first preferred embodiment of the present invention, the silicon containing dielectric layer etching predominant plasma 18 employs a second etchant gas composition comprising a second perfluoro etchant gas which predominantly etches the partially etched silicon containing dielectric layer 12' in forming the patterned silicon containing dielectric layers 12a and 12b in comparison with forming a fluorocarbon polymer layer similar to the fluorocarbon polymer layer 17 as illustrated in FIG. 2. Thus, the fluorocarbon polymer layer 17 as illustrated within the microelectronics fabrication whose schematic cross-sectional diagram is illustrated in FIG. 2 is substantially etched in forming the microelectronics fabrication whose schematic cross-sectional diagram is illustrated in FIG. 3.

Within the first preferred embodiment of the present invention, perfluoro etchant gases which may be employed within the silicon containing dielectric layer etching predominant plasma 18 include, but are not limited to, carbon tetrafluoride, hexafluoroethane and sulfur hexafluoride. The second etchant gas composition which is employed within the silicon containing dielectric layer etching predominant plasma 18 also preferably includes, but is not limited to, additional etchant gases, sputtering gases, and cooling gases as are conventional in the art of plasma etch methods employed in etching silicon containing dielectric layers within microelectronics fabrications. Such additional etchant gases may include, but are not limited to, fluorocarbon etchant gases having a hydrogen:carbon atomic ratio no greater than about 1:1 and a fluorine:carbon atomic ratio of greater than about 2:1. Such fluorocarbon etchant gases may include, but are not limited to, trifluoromethane and other higher order straight chain, branched chain and cyclic fluorocarbon etchant gases which fulfill the above hydrogen:carbon atomic ratio and fluorine:carbon atomic ratio conditions.

Upon etching within the silicon containing dielectric layer etching predominant plasma 18 the partially etched silicon containing dielectric layer 12' to form the patterned silicon containing dielectric layers 12a and 12b, there is formed from the silicon containing dielectric layer 12 a patterned silicon containing dielectric layer having a via formed therethrough with an improved etch rate and with an improved via sidewall profile in comparison with an otherwise equivalent patterned silicon containing dielectric layer having an otherwise equivalent via formed therethrough employing an otherwise equivalent plasma etch method absent the fluorocarbon polymer layer deposition predominant plasma 16.

Second Preferred Embodiment

Figure 4:
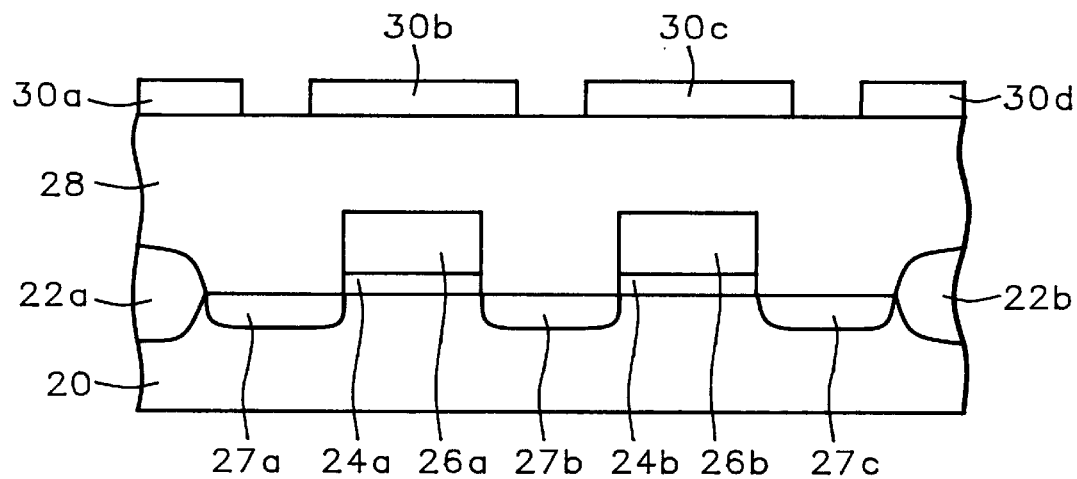
FIG. 4 to FIG. 9 show a series of schematic cross-sectional diagrams illustrating the results of progressive stages in forming within an integrated circuit microelectronics fabrication two series of patterned silicon containing dielectric layers having two series of vias formed therethrough in accord with a more specific preferred embodiment of the present invention which comprises a second preferred embodiment of the present invention.

Referring now to FIG. 4 to FIG. 9, there is shown a series of schematic cross-sectional diagrams illustrating the results of progressive stages in forming from two silicon containing dielectric layers within an integrated circuit microelectronics fabrication two series of patterned silicon containing dielectric layers having several vias formed therethrough in accord with a more specific preferred embodiment of the present invention which comprises a second preferred embodiment of the present invention. Shown in FIG. 4 is a schematic cross-sectional diagram of the integrated circuit microelectronics fabrication at an early stage in its fabrication.

Shown in FIG. 4 is a semiconductor substrate 20 having formed within and upon its surface a pair of isolation regions 22a and 22b which define an active region of the semiconductor substrate 20. Although it is known in the art of integrated circuit microelectronics fabrication that semiconductor substrates are available with either dopant polarity, various dopant concentrations and several crystallographic orientations, for the second preferred embodiment of the present invention the semiconductor substrate 20 is preferably a (100) silicon semiconductor substrate having an N- or P- doping.

Similarly, although it is also known in the art of integrated circuit microelectronics fabrication that isolation regions may be formed within and/or upon semiconductor substrates through methods including but not limited to isolation region thermal growth methods and isolation region deposition/patterning methods, for the second preferred embodiment of the present invention the isolation regions 22a and 22b are preferably formed within and upon the semiconductor substrate 20 through an isolation region thermal growth method to form the isolation regions 22a and 22b of silicon oxide within and upon the semiconductor substrate 20.

Shown also within FIG. 4 formed within and upon the active region of the semiconductor substrate 20 is a pair of field effect transistors (FETs) which comprise a series of structures including: (1) a pair of gate dielectric layers 24a and 24b formed upon the active region of the semiconductor substrate 20, each gate dielectric layer 24a or 24b having formed and aligned thereupon; (2) a gate electrode 26a or 26b; and (3) a series of source/drain regions 27a, 27b and 27c formed within the active region of the semiconductor substrate 20 at areas not covered by the pair of gate dielectric layers 24a and 24b and the pair of gate electrode 26a and 26b, where the source/drain region 27b is shared by the pair of field effect transistors (FETs). Each of the structures within the series of structures which comprises the pair of field effect transistors (FETs) may be formed through methods and materials as are conventional in the art of field effect transistor (FET) fabrication.

For example, although it is known in the art of field effect transistor (FET) fabrication that gate dielectric layers may be formed through patterning, through methods as are conventional in the art, of blanket gate dielectric layers formed upon active regions of semiconductor substrates through methods including but not limited to blanket gate dielectric layer thermal growth methods and blanket gate dielectric layer deposition/patterning methods, for the second preferred embodiment of the present invention the pair of gate dielectric layers 24a and 24b is preferably formed through patterning, through methods as are conventional in the art, of a blanket gate dielectric layer formed through a blanket gate dielectric layer thermal growth method to form the blanket gate dielectric layer of silicon oxide upon the active region of the semiconductor substrate 20.

Similarly, although it is also know in the art of field effect transistor (FET) fabrication that gate electrodes may be formed through patterning, through methods as are conventional in the art, of blanket gate electrode material layers formed of gate electrode materials including but not limited to metals, metal alloys, doped polysilicon or polycides (doped polysilicon/metal silicide stacks), for the second preferred embodiment of the present invention the pair of gate electrodes 26a and 26b is preferably formed through patterning, through methods as are conventional in the art, of a blanket layer of a doped polysilicon or polycide gate electrode material formed upon the blanket gate dielectric layer.

Finally, it is also known in the art of field effect transistor (FET) fabrication that source/drain regions are typically formed into active regions of a semiconductor substrate through ion implantation methods employing dopant ions of polarity opposite the polarity of the semiconductor substrate within which is formed those source/drain regions. For the second preferred embodiment of the present invention, the series of source/drain regions 27a, 27b and 27c is preferably formed within the active region of the semiconductor substrate 20 through a high dose ion implant while employing the pair of gate electrodes 26a and 26b and the pair of gate dielectric layers 24a and 24b as an ion implantation mask. The high dose ion implant is of polarity appropriate to the pair of field effect transistors (FETs) and the semiconductor substrate 20.

There is also shown within FIG. 4 formed upon the semiconductor substrate 20 and the series of structures which forms the pair of field effect transistors (FETs) a planarized pre-metal dielectric (PMD) layer 28. Methods and materials through which planarized pre-metal dielectric (PMD) layers may be formed within integrated circuit microelectronics fabrications are known in the art of integrated circuit fabrication microelectronics fabrication. Planarized pre-metal dielectric (PMD) layers may be formed within integrated circuit microelectronics fabrications through methods including but not limited to chemical vapor deposition (CVD) methods, plasma enhanced chemical vapor deposition (PECVD) methods and physical vapor deposition (PVD) sputtering methods, along with reactive ion etch (RIE) etchback planarizing methods and chemical mechanical polish (CMP) planarizing methods, through which may be formed planarized pre-metal dielectric (PMD) layers of dielectric materials including but not limited to silicon oxide dielectric materials, silicon nitride dielectric materials and silicon oxynitride dielectric materials. For the second preferred embodiment of the present invention, the planarized pre-metal dielectric (PMD) layer 28 is preferably formed of a silicon oxide dielectric material deposited through a plasma enhanced chemical vapor deposition (PECVD) method and subsequently planarized through a chemical mechanical polish (CMP) planarizing method, as is common in the art of integrated circuit microelectronics fabrication, although other methods and materials may also be employed in forming the planarized pre-metal dielectric (PMD) layer 28.

Finally, there is shown in FIG. 4 a series of first hard mask layers 30a, 30b, 30c and 30d formed upon the planarized pre-metal dielectric (PMD) layer 28. The series of first hard mask layers 30a, 30b, 30c and 30d is preferably formed through methods and materials, and to dimensions, analogous or equivalent to the methods, materials and dimensions employed in forming the hard mask layers 14a and 14b within the first preferred embodiment of the present invention within the microelectronics fabrication whose schematic cross-sectional diagram is illustrated in FIG. 1 to FIG. 3.

Figure 5:
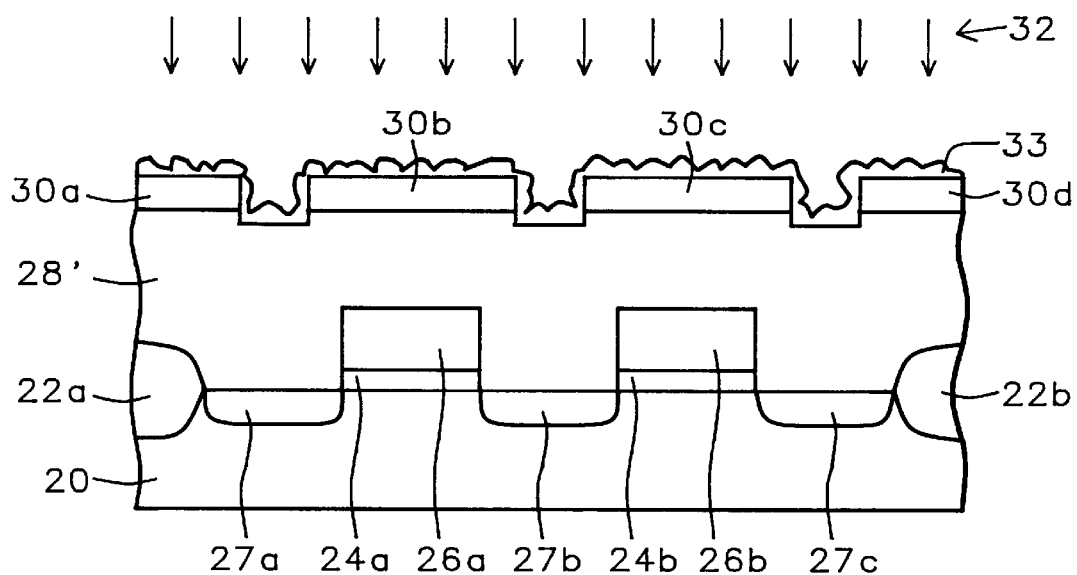

Referring now to FIG. 5, there is shown a schematic cross-sectional diagram illustrating the results of further processing of the integrated circuit microelectronics fabrication whose schematic cross-sectional diagram is illustrated in FIG. 4. Shown in FIG. 5 is a schematic cross-sectional diagram of an integrated circuit microelectronics fabrication otherwise equivalent to the integrated circuit microelectronics fabrication whose schematic cross-sectional diagram is illustrated in FIG. 4, but wherein the planarized pre-metal dielectric (PMD) layer 28 has been partially etched within a first fluorocarbon polymer layer deposition predominant plasma 32 to form a partially etched planarized pre-metal dielectric (PMD) layer 28'. When etching the planarized pre-metal dielectric (PMD) layer 28 within the first fluorocarbon polymer layer deposition predominant plasma 32 to form the partially etched planarized pre-metal dielectric (PMD) layer 28', there is simultaneously formed the first fluorocarbon polymer layer 33 upon at least the series of first hard mask layers 30a, 30b, 30c and 30d and more preferably upon exposed portions of the partially etched planarized pre-metal dielectric (PMD) layer 28' and the series of first hard mask layers 30a, 30b, 30c and 30d.

Within the second preferred embodiment of the present invention, the first fluorocarbon polymer layer deposition predominant plasma 32 is preferably formed through methods and materials analogous or equivalent to the methods and materials employed in forming the fluorocarbon polymer layer deposition predominant plasma 16 within the first preferred embodiment of the present invention as illustrated in FIG. 2. More preferably, within the second preferred embodiment of the present invention, the first fluorocarbon polymer layer deposition predominant plasma 32 employs a first etchant gas composition comprising [mono] fluoromethane. Preferably, the first fluorocarbon polymer layer deposition predominant plasma 32 also employs: (1) a reactor chamber pressure of from about 80 to about 150 mtorr; (2) a source radio frequency power of from about 600 to about 1100 watts at a source radio frequency of 13.56 MHZ; (3) a magnetic assist of from about 20 to about 60 gauss; (4) a semiconductor substrate 20 temperature of from about 10 to about 150 degrees centigrade; (5) a fluoromethane flow rate of from about 60 to about 180 standard cubic centimeters per minute (sccm); and (6) an fluorocarbon polymer layer deposition/silicon containing dielectric layer etching time of from about 10 to about 30 seconds, to form the first fluorocarbon polymer layer 33 of from about 100 to about 300 angstroms thickness.

Similarly with the first preferred embodiment of the present invention, within the second preferred embodiment of the present invention the first fluorocarbon polymer layer deposition predominant plasma 32 predominantly deposits the first fluorocarbon polymer layer 33 in comparison with etching the planarized pre-metal dielectric (PMD) layer 28 in forming the partially etched planarized pre-metal dielectric (PMD) layer 28'. Typically and preferably, less than about 100 angstroms of the planarized pre-metal dielectric (PMD) layer 28 is etched in forming the partially etched planarized pre-metal dielectric (PMD) layer 28'.

Figure 6:
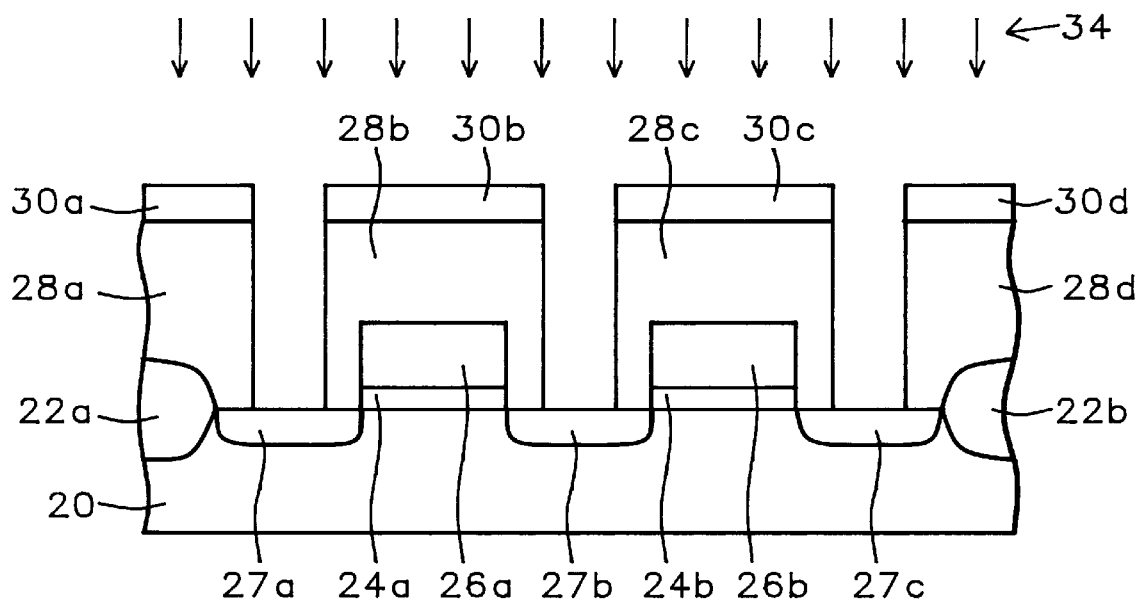

Referring now to FIG. 6, there is shown a schematic cross-sectional diagram illustrating the results of further processing of the integrated circuit microelectronics fabrication whose schematic cross-sectional diagram is illustrated in FIG. 5. Shown in FIG. 6 is a schematic cross-sectional diagram of an integrated circuit microelectronics fabrication otherwise equivalent to the integrated circuit microelectronics fabrication whose schematic cross-sectional diagram is illustrated in FIG. 5, but wherein the partially etched planarized pre-metal dielectric (PMD) layer 28' has been completely etched to form the patterned planarized pre-metal dielectric layers 28a, 28b, 28c and 28d defining a series of three contact vias reaching the source/drain regions 27a, 27b and 27c, through etching within a pre-metal dielectric (PMD) layer etching predominant plasma 34.

Within the second preferred embodiment of the present invention, the pre-metal dielectric layer etching predominant plasma 34 is preferably formed through methods and materials analogous or equivalent to the methods and materials employed in forming the silicon containing dielectric layer etching predominant plasma 18 within the first preferred embodiment of the present invention as illustrated within the schematic cross-sectional diagram of FIG. 3. More preferably, the pre-metal dielectric (PMD) layer etching predominant plasma 34 employs a first etchant gas composition comprising a perfluorocarbon etchant gas, a hydrofluorocarbon etchant gas, an argon sputtering gas and a nitrogen cooling gas. Most preferably the pre-metal dielectric (PMD) layer etching predominant plasma employs a carbon tetrafluoride perfluorocarbon etchant gas, a trifluoromethane hydrofluorocarbon etchant gas, an argon sputtering gas and a nitrogen cooling gas. Preferably, the pre-metal dielectric (PMD) layer etching predominant plasma 34 also employs: (1) a reactor chamber pressure of from about 80 to about 150 mtorr; (2) a source radio frequency power of from about 600 to about 1100 watts at a source radio frequency of 13.56 MHZ; (3) a magnetic assist of from about 20 to about 60 gauss; (4) a semiconductor substrate 20 temperature of from about 10 to about 150 degrees centigrade; (5) a trifluoromethane flow rate of from about 60 to about 180 standard cubic centimeters per minute (sccm); (6) a carbon tetrafluoride flow rate of from about 20 to about 90 standard cubic centimeters per minute (sccm); (7) an argon flow rate of from about 50 to about 150 standard cubic centimeters per minute (sccm); and (8) a nitrogen flow rate of from about 10 to about 30 standard cubic centimeters per minute (sccm), for a time period sufficient to completely etch the partially etched planarized pre-metal dielectric (PMD) layer 28' in forming the patterned planarized pre-metal dielectric (PMD) layers 28a, 28b, 28c and 28d.

Similarly with the first preferred embodiment of the present invention, the pre-metal dielectric (PMD) layer etching predominant plasma 34 as illustrated within the schematic cross-sectional diagram of FIG. 6 predominantly etches the partially etched planarized pre-metal dielectric (PMD) layer 28' in forming the patterned planarized pre-metal dielectric (PMD) layers 28a, 28b, 28c and 28d in comparison with fluorocarbon polymer layer deposition such as the fluorocarbon polymer layer 33 deposition as illustrated within the schematic cross-sectional diagram of FIG. 5. Thus, the fluorocarbon polymer layer 33 is substantially consumed in forming the integrated circuit microelectronics fabrication whose schematic cross-sectional diagram is illustrated in FIG. 6 from the integrated circuit microelectronics fabrication whose schematic cross-sectional diagram is illustrated in FIG. 5.

Also similarly with the first preferred embodiment of the present invention, the series of contact vias defined by the pattered planarized pre-metal dielectric layers 28a, 28b, 28c and 28d are formed with an improved etch rate and an improved via sidewall profile in comparison with an otherwise equivalent series of contact vias defined by an otherwise equivalent series of patterned planarized pre-metal dielectric (PMD) layers formed with a pre-metal dielectric (PMD) layer etching predominant plasma absent a fluorocarbon polymer layer deposition predominant plasma.

Figure 7:
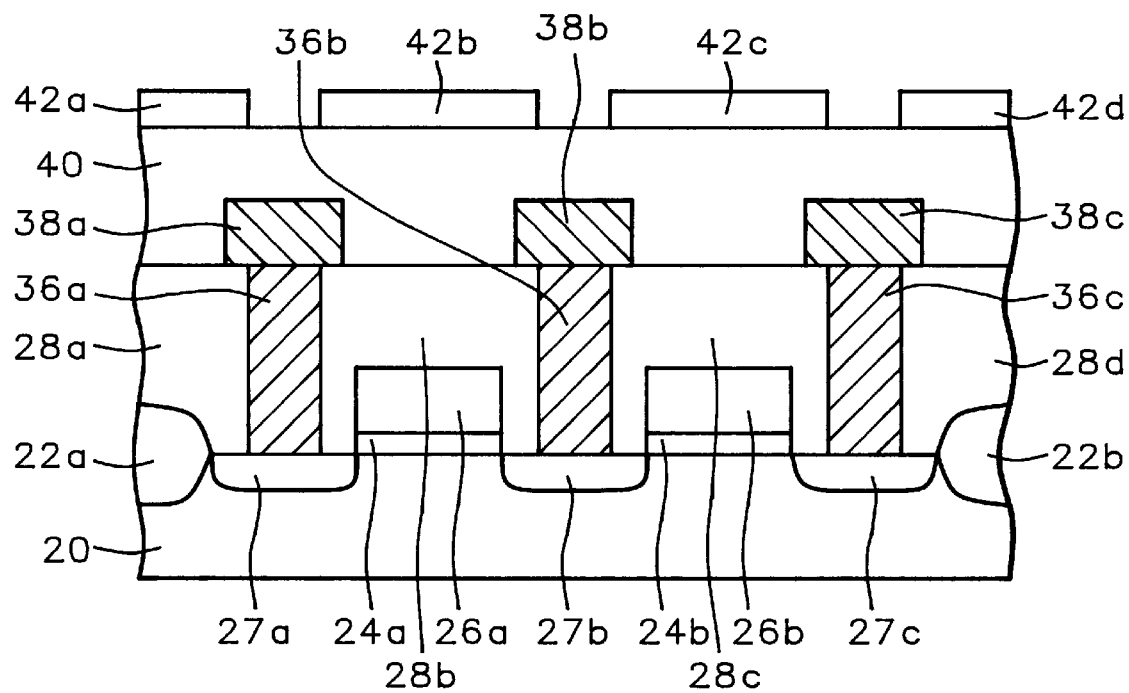

Referring now to FIG. 7, there is shown a schematic cross-sectional diagram illustrating the results of further processing of the integrated circuit microelectronics fabrication whose schematic cross-sectional diagram is illustrated in FIG. 6. Shown in FIG. 7 is a schematic cross-sectional diagram of an integrated circuit microelectronics fabrication otherwise equivalent to the integrated circuit microelectronics fabrication whose schematic cross-sectional diagram is illustrated in FIG. 6, but wherein: (1) the first hard mask layers 30a, 30b, 30c and 30d are stripped from the integrated circuit microelectronics fabrication; (2) there is formed within the series of contact vias defined by the patterned planarized pre-metal dielectric (PMD) layers 28a, 28b, 28c and 28d a series of conductive contact studs 36a, 36b and 36c; (3) there is formed upon the patterned planarized pre-metal dielectric layers 28a, 28b, 28c and 28d and contacting the conductive contact studs 36a, 36b and 36c a corresponding series of patterned first conductor layers 36a, 36b and 38c; (4) there is formed upon exposed portions of the patterned planarized pre-metal dielectric (PMD) layers 28a, 28b, 28c and 28d and the patterned first conductor layers 38a, 38b and 38c a planarized inter-metal dielectric (IMD) layer 40; and (5) there is formed upon the planarized inter-metal dielectric (IMD) layer 40 a series of second hard mask layers 42a, 42b, 42c and 42d. Each of the foregoing layers may be stripped from or formed upon the integrated circuit microelectronics fabrication whose schematic cross-sectional diagram is illustrated in FIG. 6 to form the integrated circuit microelectronics fabrication whose schematic cross-sectional diagram is illustrated in FIG. 7 through methods and materials as are conventional in the art of integrated circuit microelectronics fabrication, with the exception of the second hard mask layers 42a, 42b, 42c and 42d which may be formed through methods and materials analogous or equivalent to the methods and materials employed in forming the first hard mask layers 30a, 30b, 30c and 30d as illustrated in FIG. 4.

With respect to stripping the first hard mask layers 30a, 30b, 30c and 30d from the integrated circuit microelectronics fabrication whose schematic cross-sectional diagram is illustrated in FIG. 6 to provide in part the integrated circuit microelectronics fabrication whose schematic cross-sectional diagram is illustrated in FIG. 7, such hard mask layers may be stripped through methods as are conventional within integrated circuit fabrication, which will typically although not exclusively include wet chemical stripping methods.

With respect to forming within the integrated circuit microelectronics fabrication whose schematic cross-sectional diagram is illustrated in FIG. 7 the series of conductive contact studs 36a, 36b and 36c, although it is known in the art of integrated circuit microelectronics fabrication that conductive contact studs may be formed through methods and materials including but not limited to thermally assisted evaporation methods, electron beam assisted evaporation methods, chemical vapor deposition (CVD) methods and physical vapor deposition (PVD) sputtering methods through which may be formed conductive contact studs of conductive materials including but not limited to metals, metal alloys, doped polysilicon and polycides (doped polysilicon/metal silicide stacks) for the second preferred embodiment of the present invention the conductive contact studs 36a, 36b and 36c are preferably formed into the series of apertures defined by the patterned planarized pre-metal dielectric (PMD) layers 28a, 28b, 28c and 28c at least in part of a tungsten material deposited through a chemical vapor deposition (CVD) method, as is most common in the art of integrated circuit microelectronics fabrication. Preferably, the conductive studs 36a, 36b and 36c are each formed to a thickness sufficient to reach the upper surface of the patterned planarized pre-metal dielectric (PMD) layers 28a, 28b, 28c and 28d while contacting the corresponding source/drain region 27a, 27b or 27c.

With respect to forming the patterned first conductor layers 38a, 38b and 38c within the integrated circuit microelectronics fabrication whose schematic cross-sectional diagram is illustrated in FIG. 7, although it is known in the art of integrated circuit microelectronics fabrication that patterned conductor layers may be formed through methods and materials including but not limited to thermally assisted evaporation methods, electron beam assisted evaporation methods, chemical vapor deposition methods and physical vapor deposition (PVD) sputtering methods through which may be formed patterned conductor layers of conductive materials including but not limited to metals, metal alloys, doped polysilicon and polycides, for the second preferred embodiment of the present invention, the patterned first conductor layers 38a, 38b and 38c are preferably formed at least in part of a aluminum containing conductor material, as is common in the art of integrated circuit microelectronics fabrication.

With respect to the planarized inter-metal dielectric (IMD) layer 40 within the integrated circuit microelectronics fabrication whose schematic cross-sectional diagram is illustrated in FIG. 7, the planarized inter-metal dielectric (IMD) layer 40 is preferably formed through methods and materials, and with dimensions, analogous or equivalent to the methods, materials and dimensions employed in forming the planarized pre-metal dielectric (PMD) layer 28 as illustrated within the schematic cross-sectional diagram of FIG. 4.

Figure 8:
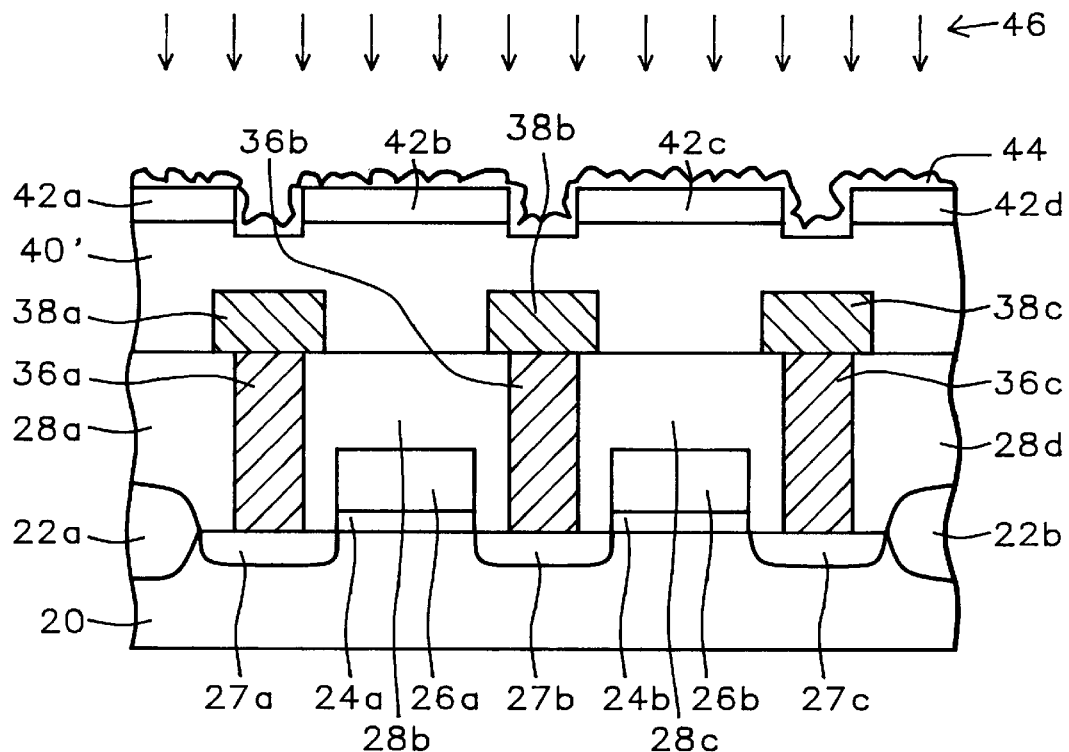

Referring now to FIG. 8, there is shown a schematic cross-sectional diagram illustrating the results of further processing of the integrated circuit microelectronics fabrication whose schematic cross-sectional diagram is illustrated in FIG. 7. Shown in FIG. 8 is a schematic cross-sectional diagram of an integrated circuit microelectronics fabrication otherwise equivalent to the integrated circuit microelectronics fabrication whose schematic cross-sectional diagram is illustrated in FIG. 7, but wherein the planarized inter-metal dielectric (IMD)) layer 40 has been partially etched in forming the partially etched planarized inter-metal dielectric (IMD) layer 40' within a second fluorocarbon polymer layer deposition predominant plasma 46. Similarly with the first preferred embodiment of the present invention, within the second preferred embodiment of the present invention there is formed upon at least the second hard mask layers 42a, 42b, 42c and 42d and preferably the exposed portions of partially etched planarized inter-metal dielectric (IMD) layer 40' and the second hard mask layers 42a, 42b, 42c and 42d a second fluorocarbon polymer layer 44 simultaneously with etching the planarized inter-metal dielectric (IMD) layer 40 to form the partially etched planarized inter-metal dielectric (IMD) layer 40' within the second fluorocarbon polymer layer deposition predominant plasma 46.

Within the second preferred embodiment of the present invention, the second fluorocarbon polymer layer deposition predominant plasma 46 preferably employs methods, materials and conditions analogous or equivalent to the methods, materials and conditions employed in forming the first fluorocarbon polymer layer deposition predominant plasma 32 as illustrated within FIG. 5. Similarly, the second fluorocarbon polymer layer 44 as illustrated within the schematic cross-sectional diagram of FIG. 8 is preferably formed with a composition and thickness analogous or equivalent to the composition and thickness of the first fluoropolymer layer 33 as illustrated within the schematic cross-sectional diagram of FIG. 5.

Figure 9:
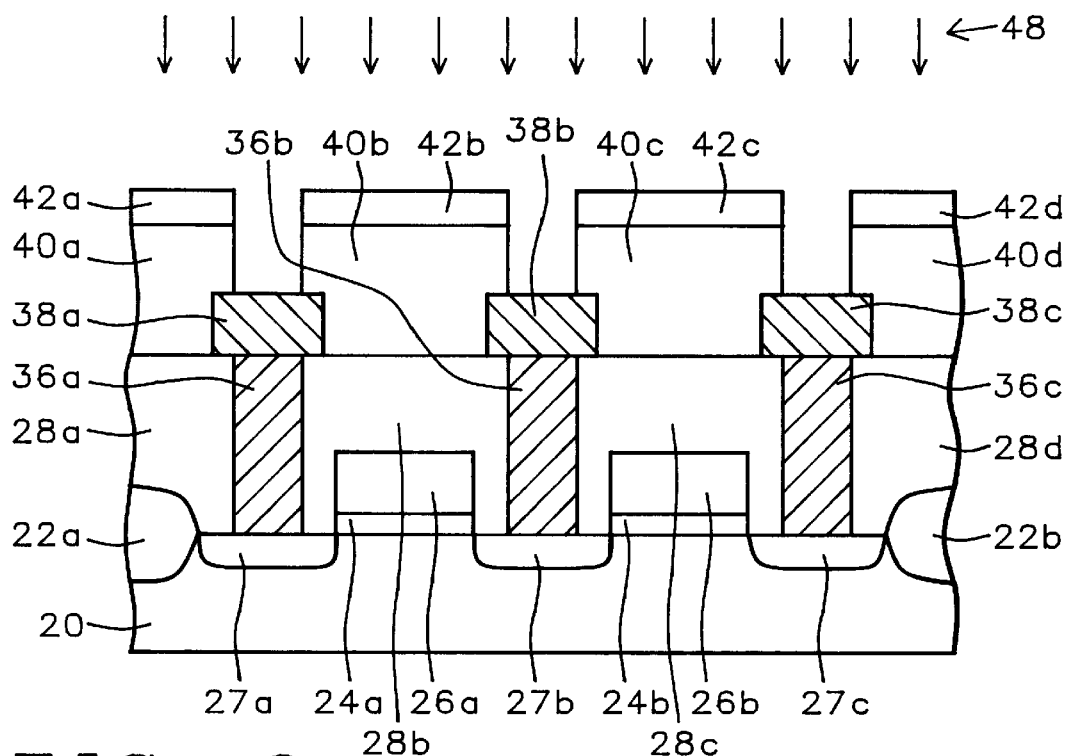

Referring now to FIG. 9, there is shown a schematic cross-sectional diagram illustrating the results of further processing of the integrated circuit microelectronics fabrication whose schematic cross-sectional diagram is illustrated in FIG. 8. Shown in FIG. 9 is a schematic cross-sectional diagram of an integrated circuit microelectronics fabrication otherwise equivalent to the integrated circuit microelectronics fabrication whose schematic cross-sectional diagram is illustrated in FIG. 8, but wherein the partially etched planarized inter-metal dielectric (IMD) layer 40' whose schematic cross-sectional diagram is illustrated in FIG. 8 is completely etched within an inter-metal dielectric (IMD) layer etching predominant plasma 48. The inter-metal dielectric (IMD) layer etching predominant plasma 48 employed in forming from the partially etched planarized inter-metal dielectric (IMD) layer 40' as illustrated within the schematic cross-sectional diagram of FIG. 8 the patterned planarized inter-metal dielectric (IMD) layers 40a, 40b, 40c and 40d as illustrated within the schematic cross-sectional diagram of FIG. 9 is preferably formed employing methods, materials and conditions analogous or equivalent to the methods, materials and conditions employed in forming the pre-metal dielectric (PMD) layer etch predominant plasma 34 employed in forming from the partially etched planarized pre-metal dielectric (PMD) layer 28' whose schematic cross-sectional diagram is illustrated in FIG. 5 the patterned planarized pre-metal dielectric (PMD) layers 28a, 28b, 28c and 28d within the schematic cross-sectional diagram of FIG. 6.

Upon forming the patterned planarized inter-metal dielectric (IMD) layers 40a, 40b, 40c and 40d as illustrated within the schematic cross-sectional diagram of FIG. 9, there is formed an integrated circuit microelectronics fabrication having formed therein two series of patterned planarized silicon containing dielectric layers having formed therethrough two series of vias with improved etch rates and improved via sidewall profiles. The two series of patterned planarized silicon containing dielectric layers are formed with improved etch rates and improved via sidewall profiles in comparison with otherwise equivalent silicon containing dielectric layers formed through a method otherwise equivalent to the method of the present invention but absent the fluorocarbon polymer layer deposition predominant plasmas.

EXAMPLES

Upon each semiconductor substrate within two series of semiconductor substrates was formed a blanket silicon oxide dielectric layer to a thickness of about 10000 angstroms through a plasma enhanced chemical vapor deposition (PECVD) method employing tetra ethyl ortho silicate (TEOS) as a silicon source material. Upon each blanket silicon oxide dielectric layer was formed a patterned titanium nitride hard mask layer formed to a thickness about 1400 angstroms. The patterned titanium nitride hard mask layers were formed through photolithographic methods as are conventional in the art of integrated circuit microelectronics fabrication. A series of patterned photoresist etch mask layers employed in defining the series of patterned titanium nitride hard mask layers was stripped from the patterned titanium nitride hard mask layers through an oxygen plasma stripping method as is similarly conventional in the art of integrated circuit microelectronics fabrication. Each patterned titanium nitride hard mask layer defined circular apertures of diameter about 3000 angstroms and pitch dimension of about 4000 angstroms exposing a high areal density region of a blanket silicon oxide dielectric layer formed thereunder through which a series of high areal density vias was to be formed.

The blanket silicon oxide dielectric layers upon a first series of the two series of semiconductor substrates were then etched employing the two step fluorocarbon polymer layer deposition predominant plasma etch method and silicon containing dielectric layer etching predominant plasma etch method in accord with the preferred embodiments of the present invention. The fluorocarbon polymer layer deposition predominant plasma etch method employed a first etchant gas composition consisting of [mono] fluoromethane. The fluorocarbon polymer layer deposition predominant plasma etch method also employed: (1) a reactor chamber pressure of about 150 mtorr; (2) a source radio frequency power of about 1100 watts a a source radio frequency of 13.56 MHZ; (3) a magnetic assist of about 20 gauss; (4) a semiconductor substrate temperature of about 15 degrees centigrade; (5) a fluoromethane flow rate of about 180 standard cubic centimeters per minute (sccm); and (6) an exposure time of about 10 seconds, to form from a blanket silicon oxide dielectric layer a partially etched blanket silicon oxide dielectric layer and to form upon at least the patterned titanium nitride hard mask layer a fluorocarbon polymer layer.

The partially etched blanket silicon oxide dielectric layer was then additionally etched employing a silicon containing dielectric layer etching predominant plasma employing a second etchant gas composition comprising a carbon tetrafluoride perfluoro etchant gas. The second etchant gas composition employed a trifluoromethane hydrofluorocarbon etchant gas, an argon sputtering gas and a nitrogen cooling gas. The silicon containing dielectric layer etching predominant plasma also employed: (1) a reactor chamber pressure of about 150 mtorr; (2) a source radio frequency power of about 1100 watts at a source radio frequency of 13.56 MHZ; (3) a magnetic assist of about 20 gauss; (4) a semiconductor substrate temperature of about 15 degrees centigrade; (5) a trifluoromethane flow rate of about 60 standard cubic centimeters per minute (sccm); (6) a carbon tetrafluoride flow rate of about 30 standard cubic centimeters per minute (sccm); (7) an argon flow rate of about 100 standard cubic centimeters per minute (sccm); (8) a nitrogen flow rate of about 20 standard cubic centimeters per minute (sccm); and (9) an exposure time of about 120 seconds, to form a series of further etched blanket silicon oxide dielectric layers.

The blanket silicon oxide dielectric layers upon a second series of the two series of semiconductor substrates was etched with only the silicon containing dielectric layer etching predominant plasma employed in etching the partially etched silicon oxide dielectric layers upon the first series of the two series of semiconductor substrates, but not with the fluorocarbon polymer layer deposition predominant plasma.

The etch rates and the via sidewall profiles obtained for the via like apertures formed within the silicon oxide dielectric layers upon each semiconductor substrate within the two series of semiconductor substrates were then determined through scanning electron microscopy cross-sectioning of the semiconductor substrates. The observed values for the etch rates and via sidewall profiles are reported in Table I.

TABLE I

| Etch Method | Etch Rate (angs/min) | Via Sidewall (SEM inspect) |
|---|---|---|
| SiO2 etch plasma only | 2200 | rough |
| FC dep plasma + SiO2 etch plasma | 4400 | smooth |

As is seen from review of the data in Table I, the two step fluorocarbon polymer layer deposition predominant plasma etch method and silicon containing dielectric layer etching predominant plasma etch method of the present invention provides through silicon containing dielectric layers such as silicon oxide dielectric layers within microelectronics fabrications such as integrated circuit microelectronics fabrications vias with improved (ie: increased) etch rates and improved (ie: smoother) via sidewall profiles in comparison with a single step plasma etch method which employs only the silicon containing dielectric layer etch predominant plasma absent the fluorocarbon polymer layer deposition predominant plasma.

As is understood by a person skilled in the art, the preferred embodiments and examples of the present invention are illustrative of the present invention rather than limiting of the present invention. Revisions and modifications may be made to methods, materials, structures and dimensions through which is provided the preferred embodiments and examples of the present invention while still providing embodiments and examples which are within the spirit and scope of the present invention, as defined by the appended claims.

What is claimed is:

1. A method for forming a patterned silicon containing dielectric layer within a microelectronics fabrication comprising:

provuiding a substrate employed within a microelectronics fabrication;

forming over the substrate a silicon containing dielectric layer;

forming upon the silicon containing dielectric layer a hard mask layer, the hard mask layer leaving exposed a portion of the silicon containing dielectric layer;

etching partially through a first plasma etch method the silicon containing dielectric layer to form a partially etched silicon containing dielectric layer, the first plasma etch method employing a first etchant gas composition comprising a first fluorocarbon etchant gas which predominantly forms a fluorocarbon polymer layer upon at least the hard mask layer; and etching through a second plasma etch method the partially etched silicon containing dielectric layer to form a patterned silicon containing dielectric layer, the second plasma etch method employing a second etchant gas composition comprising a second fluoro etchant gas which predominantly etches the partially etched silicon containing dielectric layer in forming the patterned silicon containing layer.

2. The method of claim 1 wherein the patterned silicon containing dielectric layer is formed with an improved etch rate and an improved sidewall profile in comparison with an otherwise equivalent patterned silicon containing dielectric layer formed in absence of the first plasma etch method.

3. The method of claim 1 wherein the microelectronics fabrication is chosen from the group of microelectronics fabrications consisting of integrated circuit microelectronics fabrications, solar cell microelectronics fabrications, ceramic substrate microelectronics fabrications and flat panel display microelectronics fabrications.

4. The method of claim 1 wherein the silicon containing dielectric layer is formed from a silicon containing dielectric material chosen from the group of silicon containing dielectric materials consisting of silicon oxide dielectric materials, silicon nitride dielectric materials and silicon oxynitride dielectric materials.

5. The method of claim 1 wherein the hard mask layer is formed of a hard mask material chosen from the group of hard mask materials consisting of metals, metal alloys, metal nitrides, metal oxides and silicon hard mask materials.

6. The method of claim 1 wherein the hard mask layer is firmed of a hard mask material chosen from the group of hard mask materials consisting of titanium nitride and amorphous silicon hard mask materials.

7. The method of claim 1 wherein the first fluorocarbon etchant gas is chosen from the group of fluorocarbon etchant gases consisting of fluoromethane and difluoromethane.

8. The method of claim 7 wherein the second fluoro etchant gas is chosen from the group of fluoro etchant gases consisting of trifluoromethane, carbon tetrafluoride, hexafluoroethane and sulfur hexafluoride.

9. A microelectronics fabrication having formed therein a patterned silicon containing dielectric layer formed in accord with the method of claim 1.

* * * * *